US009159452B2

(12) United States Patent
Yamada

(10) Patent No.: US 9,159,452 B2
(45) Date of Patent: Oct. 13, 2015

(54) AUTOMATIC WORD LINE LEAKAGE MEASUREMENT CIRCUITRY

(75) Inventor: Shigekazu Yamada, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 791 days.

(21) Appl. No.: 12/271,140

(22) Filed: Nov. 14, 2008

(65) Prior Publication Data

US 2010/0125429 A1    May 20, 2010

(51) Int. Cl.
*G11C 16/06*   (2006.01)
*G11C 29/02*   (2006.01)
*G11C 16/04*   (2006.01)
*G11C 29/12*   (2006.01)
*G11C 29/50*   (2006.01)

(52) U.S. Cl.
CPC .............. *G11C 29/02* (2013.01); *G11C 29/025* (2013.01); *G11C 16/04* (2013.01); *G11C 2029/1202* (2013.01); *G11C 2029/5006* (2013.01)

(58) Field of Classification Search
USPC .......................................................... 702/64
See application file for complete search history.

(56) References Cited

U.S. PATENT DOCUMENTS

| | | |
|---|---|---|
| 5,117,426 A | 5/1992 | Mcadams |
| 5,258,958 A | 11/1993 | Iwahashi et al. ......... 365/185.21 |
| 5,404,330 A | 4/1995 | Lee et al. |
| 5,428,621 A | 6/1995 | Mehrotra et al. |
| 5,504,715 A | 4/1996 | Lee et al. |
| 5,587,948 A | 12/1996 | Nakai ....................... 365/185.17 |
| 5,600,594 A | 2/1997 | Padoan et al. ............. 365/185.24 |
| 5,615,154 A | 3/1997 | Yamada ..................... 365/185.22 |
| 5,956,277 A | 9/1999 | Roohparvar ................... 365/201 |
| 5,966,330 A | 10/1999 | Tang et al. ................... 365/185.2 |
| 6,205,057 B1 | 3/2001 | Pan .......................... 365/185.21 |
| 6,226,200 B1 | 5/2001 | Eguchi et al. ............. 365/185.19 |
| 6,242,936 B1 | 6/2001 | Ho et al. |
| 6,285,598 B1 | 9/2001 | Khan et al. ................ 365/185.28 |
| 6,324,094 B1 | 11/2001 | Chevallier ................. 365/185.03 |
| 6,496,415 B2 | 12/2002 | Tsao ......................... 365/185.12 |
| 6,501,674 B2 | 12/2002 | Ashikaga ........................ 365/145 |
| 6,542,409 B2 | 4/2003 | Yamada ...................... 365/185.2 |
| 6,580,644 B1 | 6/2003 | Chung ....................... 365/185.22 |
| 6,639,833 B2 | 10/2003 | Campardo et al. |
| 6,639,849 B2 | 10/2003 | Takahashi et al. ........ 365/189.09 |
| 6,714,453 B2 | 3/2004 | Cavaleri et al. .......... 365/185.12 |
| 6,781,884 B2 | 8/2004 | Yamada ..................... 365/185.22 |
| 6,819,612 B1 | 11/2004 | Achter .......................... 365/205 |
| 6,826,066 B2 | 11/2004 | Kozaru |
| 6,839,279 B2 * | 1/2005 | Yamada ...................... 365/185.2 |
| 6,912,160 B2 | 6/2005 | Yamada ...................... 365/185.2 |
| 6,975,542 B2 | 12/2005 | Roohparvar .............. 365/185.22 |
| 7,031,210 B2 | 4/2006 | Park et al. ...................... 365/201 |
| 7,038,482 B1 | 5/2006 | Bi ................................. 324/769 |
| 7,180,781 B2 | 2/2007 | Abedifard et al. ........ 365/185.19 |

(Continued)

*Primary Examiner* — Tung S Lau
(74) *Attorney, Agent, or Firm* — Dorsey & Whitney LLP

(57) ABSTRACT

The present invention is a circuit and method for measuring leakage on the plurality of word lines in a memory device. In one embodiment, a memory device may include a leakage measurement circuit that is coupled to a plurality of word lines of the memory device. The leakage measurement circuit may be operable to generate a reference current and to determine whether a leakage current on one of the plurality of word lines is acceptable relative to the reference current. In another embodiment, a method may include determining whether leakage on one of a plurality of word lines of a memory device is allowable using a circuit in the memory device.

14 Claims, 5 Drawing Sheets

(56) References Cited

U.S. PATENT DOCUMENTS

| | | |
|---|---|---|
| 7,317,658 B2 | 1/2008 | Takazawa et al. ............ 365/233 |
| 7,336,545 B2 | 2/2008 | Tanzawa |
| 7,397,708 B2 | 7/2008 | Oh |
| 7,483,305 B2 | 1/2009 | Yamada ..................... 365/185.2 |
| 7,505,334 B1 | 3/2009 | Breitwisch et al. |
| 7,619,924 B2 | 11/2009 | Bollu et al. .............. 365/185.15 |
| 7,672,158 B2 | 3/2010 | Nakamura et al. ....... 365/185.02 |
| 7,835,178 B2 | 11/2010 | Chen et al. |
| 7,898,897 B2 | 3/2011 | Choi |
| 7,965,577 B2 | 6/2011 | Chen et al. |
| 8,432,732 B2 | 4/2013 | Li et al. |
| 8,514,630 B2 | 8/2013 | Huynh et al. |
| 2002/0071314 A1 | 6/2002 | Sakakibara et al. |
| 2002/0118574 A1 | 8/2002 | Gongwer et al. ........ 365/185.28 |
| 2002/0149965 A1 | 10/2002 | Campardo et al. |
| 2003/0151945 A1 | 8/2003 | Tanzawa |
| 2005/0105333 A1 | 5/2005 | Park et al. ................ 365/185.17 |
| 2006/0007733 A1 | 1/2006 | Tanzawa |
| 2006/0083070 A1* | 4/2006 | Arakawa ................ 365/185.21 |
| 2007/0216467 A1 | 9/2007 | Akiyama et al. |
| 2009/0116290 A1 | 5/2009 | Yamada .................. 365/185.17 |
| 2010/0125429 A1 | 5/2010 | Yamada |
| 2010/0238729 A1 | 9/2010 | Lee et al. ................. 365/185.11 |
| 2010/0329026 A1 | 12/2010 | Nakamura et al. |
| 2012/0008384 A1 | 1/2012 | Li et al. |
| 2012/0218833 A1 | 8/2012 | Yamada |
| 2012/0230107 A1 | 9/2012 | Ogura et al. |
| 2012/0281479 A1 | 11/2012 | Kochar et al. |
| 2013/0107640 A1 | 5/2013 | Yamada |
| 2014/0071772 A1 | 3/2014 | Yamada |
| 2014/0133249 A1 | 5/2014 | Yamada |

* cited by examiner

AUTOMATIC WORD LINE LEAKAGE MEASUREMENT CIRCUITRY

TECHNICAL FIELD

This invention relates generally to memory devices, and more particularly, to leakage measurement in a memory device.

BACKGROUND OF THE INVENTION

With increasing popularity of electronic devices, such as laptop computers, portable digital assistants, digital cameras, mobile phones, digital audio players, video game consoles and the like, demand for nonvolatile memories are on the rise. Nonvolatile memories come in various types, including flash memories. Flash memories are widely used nowadays for fast information storage in electronic devices such as those mentioned above.

In flash memories, data bits are stored in an array of individual memory cells, each of which includes a floating gate transistor. Generally speaking, each of the memory cells in a flash memory looks similar to a standard metal-oxide-semiconductor field-effect transistor (MOSFET), except that a flash memory cell has two gates instead of just one. One gate, the control gate, is analogous to the gate in a MOSFET. The other gate, the floating gate, is insulated all around by an oxide layer and is between the control gate and the substrate. Because the floating gate is insulated by its insulating oxide layer, any electrons placed on it get trapped there and thereby enable the storage of data. More specifically, when electrons are on the floating gate, their presence modifies, by partially canceling out, the electric field coming from the control gate. This results in the modification of the threshold voltage of the transistor, since a higher electric field is now required to enable an electrical current to flow between the source and the drain of the transistor than it would require without the electrons on the floating gate. If the number of electrons on the floating gate is sufficiently large, the resulting modified threshold voltage will be so high as to inhibit any electrical current to flow between the source and the drain when the normal operating voltage is applied to the control gate. Hence, in a typical flash memory cell that stores a binary bit, electrical current will either flow or not flow when a memory cell is being read by applying a voltage on the control gate, depending on the number of electrons on the floating gate. The flow or no flow of electrical current, in turn, translates to a binary bit 1 or 0, respectively.

In the pursuit of greater storage capacity in yet smaller chips, the flash memory density has been increasing over the years in accordance to the Moore's Law, largely due to the down scaling of the memory cell dimensions. The continued down scaling of MOS devices has created many challenges and opportunities, among them the formidable requirement for an ultra-thin gate oxide. One serious problem that comes along with thin oxide, and hinders further down scaling, is excessive leakage current. Specifically, when the oxide layer surrounding the floating gate of a flash memory cell is so thin that electrons stored on the floating gate may leak out (e.g., from the floating gate to the control gate and the word line that is coupled to the control gate, and eventually to ground), a result is that a binary bit 0 originally stored in the memory cell might now appear to be a binary bit 1.

Since the excessive leakage current for such an ultra-thin oxide will be unacceptable for very-large-scale integration (VLSI) applications, it is imperative that flash memories with unacceptable leakage current be identified during manufacturing process. As such, during manufacturing, flash memories are tested to assure that they are operating properly (e.g., having allowable leakage current). A leakage test is conducted to measure the leakage current on the word lines of each flash memory to determine whether the leakage current on any of the word lines is excessive and thus unacceptable.

Conventionally, the leakage current in memory devices is measured using external leakage measurement instrument during the manufacturing process. FIG. 1A illustrates a conventional leakage measurement system 100 showing how the leakage current in a memory device, such as a flash memory, is measured. An external leakage measurement instrument 120 is connected to a conventional memory device 110 via pad 130, which is connected to rows decoder 140 in the memory device 110. The rows decoder 140 is coupled to the word lines of the memory device (not shown). The external leakage measurement instrument 120 selects the word line on which the value of leakage current is measured by sending a selection signal to rows decoder 140, which in turn selects the word line.

FIG. 1B illustrates a conventional leakage measurement system 105 for measuring the leakage current on one of the word lines of the conventional memory device 110 of FIG. 1A. As shown, word line 150 is selected for leakage current measurement and is coupled to the external leakage measurement instrument 120 via pad 130 and rows decoder 140. Leakage paths of leakage current on a given word line may exist, for example, between a word line and another word line. One way to measure the leakage current on a given word line is to place on the word line a voltage that is different from the voltage on neighboring word lines. As a result, the voltage differential would induce leakage current to flow and thereby be detected and measured. Referring to FIG. 1B, when word line 150 is at voltage Vcc and its neighboring word line 160 is at 0 volt, a leakage current 170 may flow from word line 150 to word line 160, and is measured by the external leakage measurement instrument 120.

However, this kind of leakage measurement takes longer time than ideal since leakage current is measured from outside of the memory devices. This results in long test time and leads to long manufacturing cycle, which translates into high cost of production. There is therefore a need for a way to reduce the test time required to measure leakage current on the word lines of memory devices such as flash memories.

SUMMARY OF THE INVENTION

According to one aspect of the present invention, a memory device may include a leakage measurement circuit that is coupled to a plurality of word lines of the memory device. The leakage measurement circuit may be operable to generate a reference current and to determine whether a leakage current on one of the plurality of word lines is acceptable relative to the reference current.

According to another aspect of the present invention, a method may include determining whether leakage on one of a plurality of word lines of a memory device is allowable using a circuit in the memory device.

DETAILED DESCRIPTION OF PREFERRED EMBODIMENTS

Described herein is a memory device and method for measuring leakage on the plurality of word lines in a memory device. The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram form in order to avoid unnecessarily obscuring the present invention. Thus, the specific details set forth are merely for illustration purpose. Particular implementations may vary from these illustration details and still be contemplated to be within the spirit and scope of the present invention.

Figure 1A:
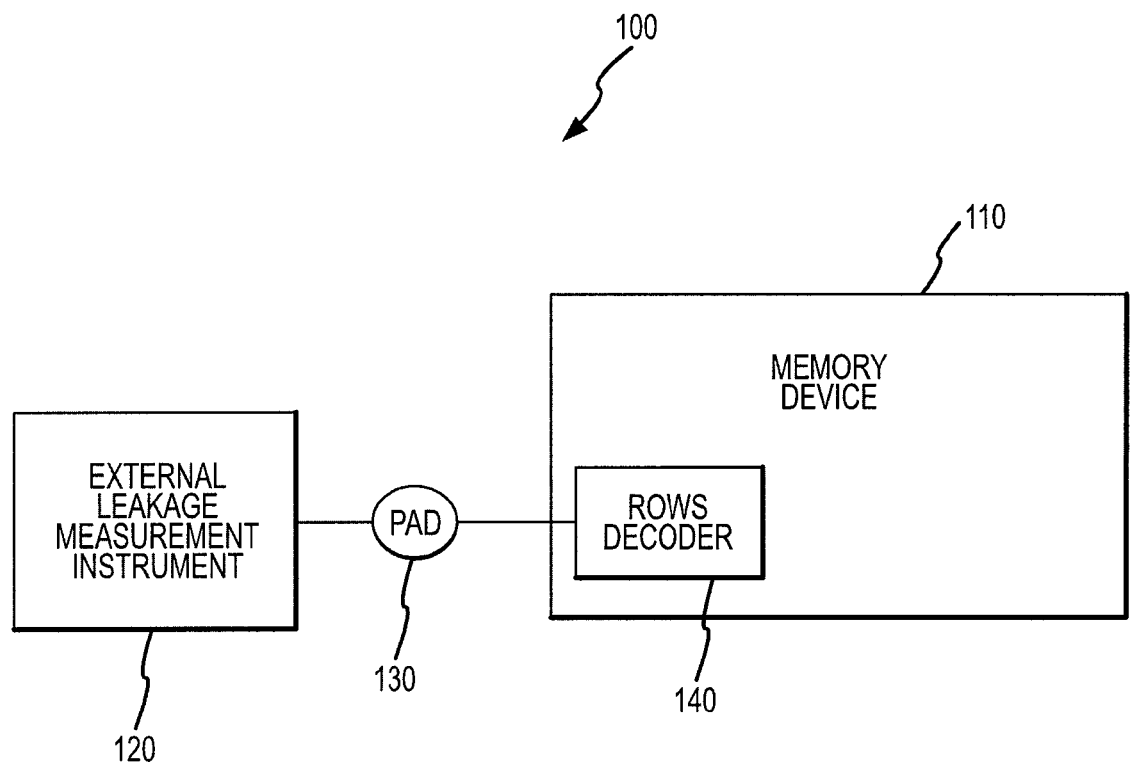
FIG. 1A is a block diagram illustrating a conventional leakage measurement system for measuring leakage in a memory device.
Figure 1B:
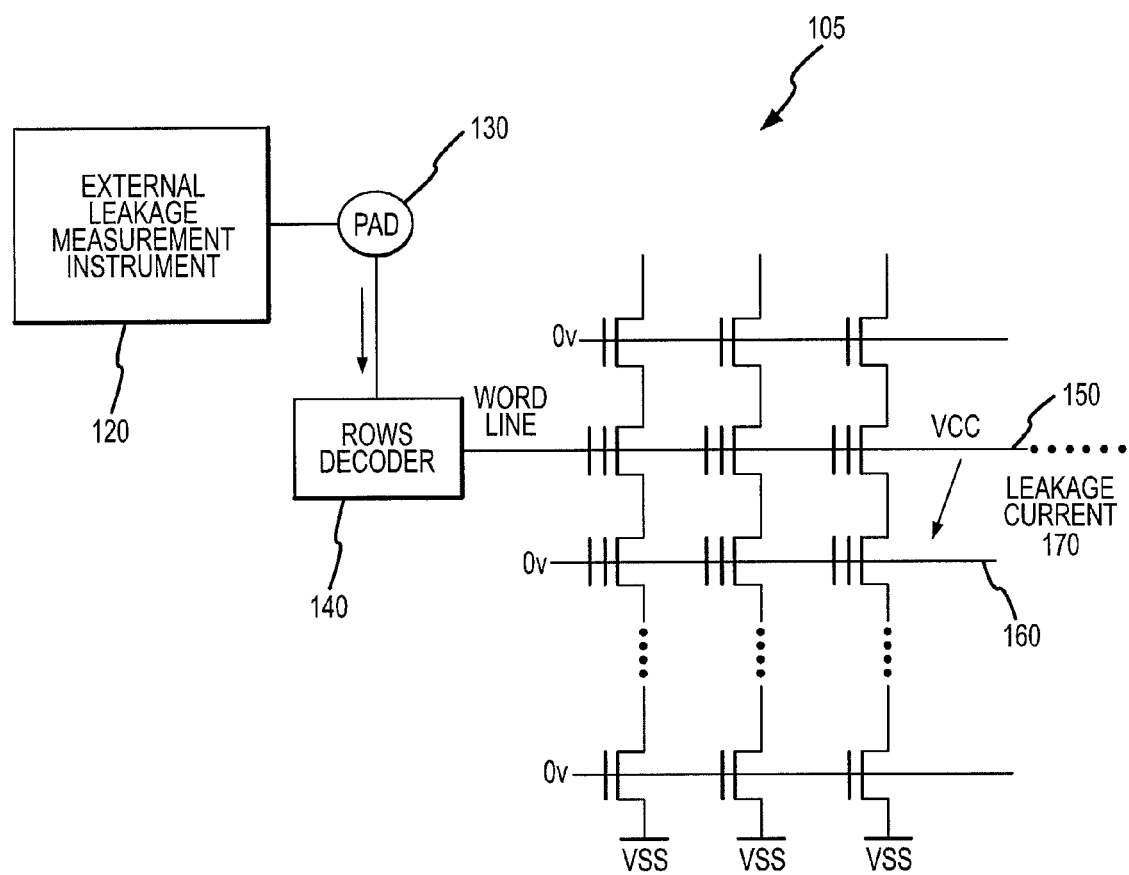
FIG. 1B is a schematic and block diagram illustrating a conventional leakage measurement system for measuring leakage current on a word line of a memory device.
Figure 2:
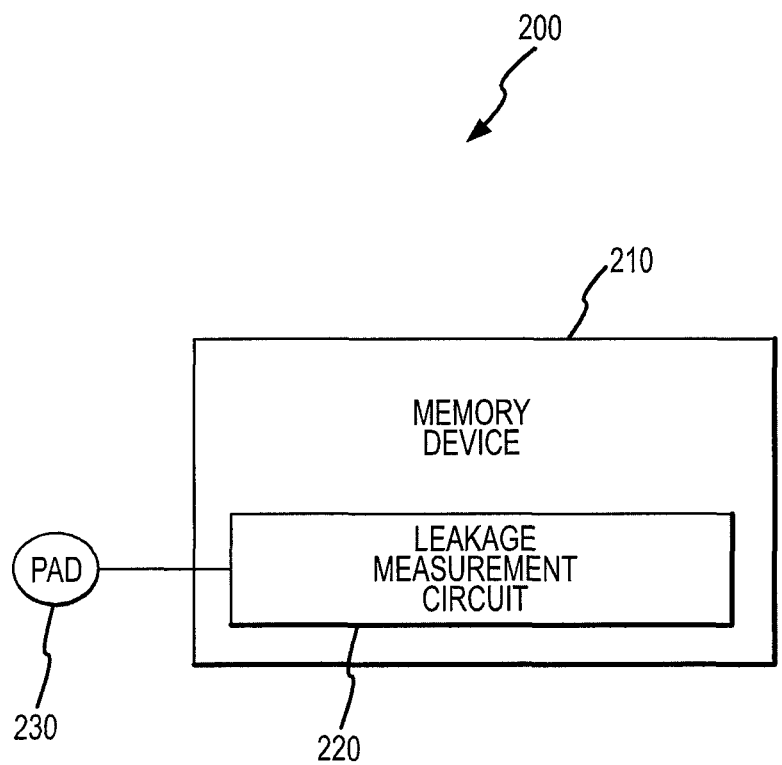
FIG. 2 is a block diagram illustrating a leakage measurement system in which a memory device has an internal leakage measurement circuit according to one embodiment of the invention.

A leakage measurement system 200 according to one embodiment of the invention is shown in FIG. 2. The memory device 210 of FIG. 2 differs from the memory device 110 of FIG. 1A by including a leakage measurement circuit 220. The leakage measurement circuit 220 in memory device 210 is coupled to the word lines (not shown) of the memory device 210. The leakage measurement circuit 220 generates a reference current and determines whether a leakage current on each one of the word lines is acceptable relative to the reference current.

In one embodiment, the leakage measurement circuit 220 in the memory device 210 may be able to generate a number of reference currents each at a current value different from the others. The leakage measurement circuit may receive an external signal for current setting through the input pad 230. Based on the decoding of this external signal, the leakage measurement circuit 220 selects one of the number of reference currents to be used to run a leakage test on each of the word lines of the memory device 210.

By varying the current value of the reference current, leakage current on each of the word lines of the memory device 210 can be measured. For example, the leakage measurement circuit 220 may initially generate a reference current at a current value of 2.5 µA, according to the current-setting external signal, and run a leakage test to determine whether the leakage on the word lines of the memory device 210 is acceptable. If, for example, the leakage test results indicate that the leakage current on each of the word lines of the memory device 210 is acceptable in comparison with the reference current (e.g., the leakage current on each of the word lines is less than 2.5 µA), a different external signal may be sent to the leakage measurement circuit 220 through the input pad 230 so that the leakage measurement circuit 220 can generate a reference current at a different current value, say, 1 µA, and run another leakage test. In this example, if during this second leakage test the leakage current on one or more of the word lines of the memory device 210 is found to be unacceptable (e.g., more than 1 µA), the leakage measurement circuit 220 can thereby determine that the leakage current on the one or more of the word lines that failed the leakage test is between 1 µA and 2.5 µA. Meanwhile, the leakage current on each of all other word lines is less than 1 µA, since the leakage current on those word lines was found to be acceptable during the second leakage test using a reference current of 1 µA.

Accordingly, during manufacturing process the memory device 210 may receive one or more external signals through the input pad 230, and each of the one or more external signals may then initiate a leakage test on the word lines of the memory device 210 that runs at a different reference current value. At the end of each of the one or more leakage tests, the leakage measurement circuit 220 may generate a PASS/FAIL signal, which can be available at and accessible externally through an output pad, that indicates whether the memory device 210 has passed the particular leakage test.

In another embodiment, the leakage measurement circuit 220 in the memory device 210 may automatically run a series of leakage tests, each of which uses a reference current generated at one current value that is different from the reference current values used in other leakage tests in the series of tests. For example, the series of leakage tests may begin with a relatively high current value for the reference current, and gradually decrease the current value for the reference current in each of the subsequent leakage test. Accordingly, when the series of leakage tests are completed, the leakage measurement circuit 220 will have measured the leakage current on each of the word lines of the memory device 210. Furthermore, the result of each of the series of tests can be accessible externally through an output pad.

Therefore, by incorporating a built-in circuit, such as the leakage measurement circuit 220, in memory devices, the leakage current on the word lines of memory devices can be automatically measured without the use of an external leakage measurement instrument. Consequently, the manufacturing cycle and the overall product cost can be reduced.

Figure 3:
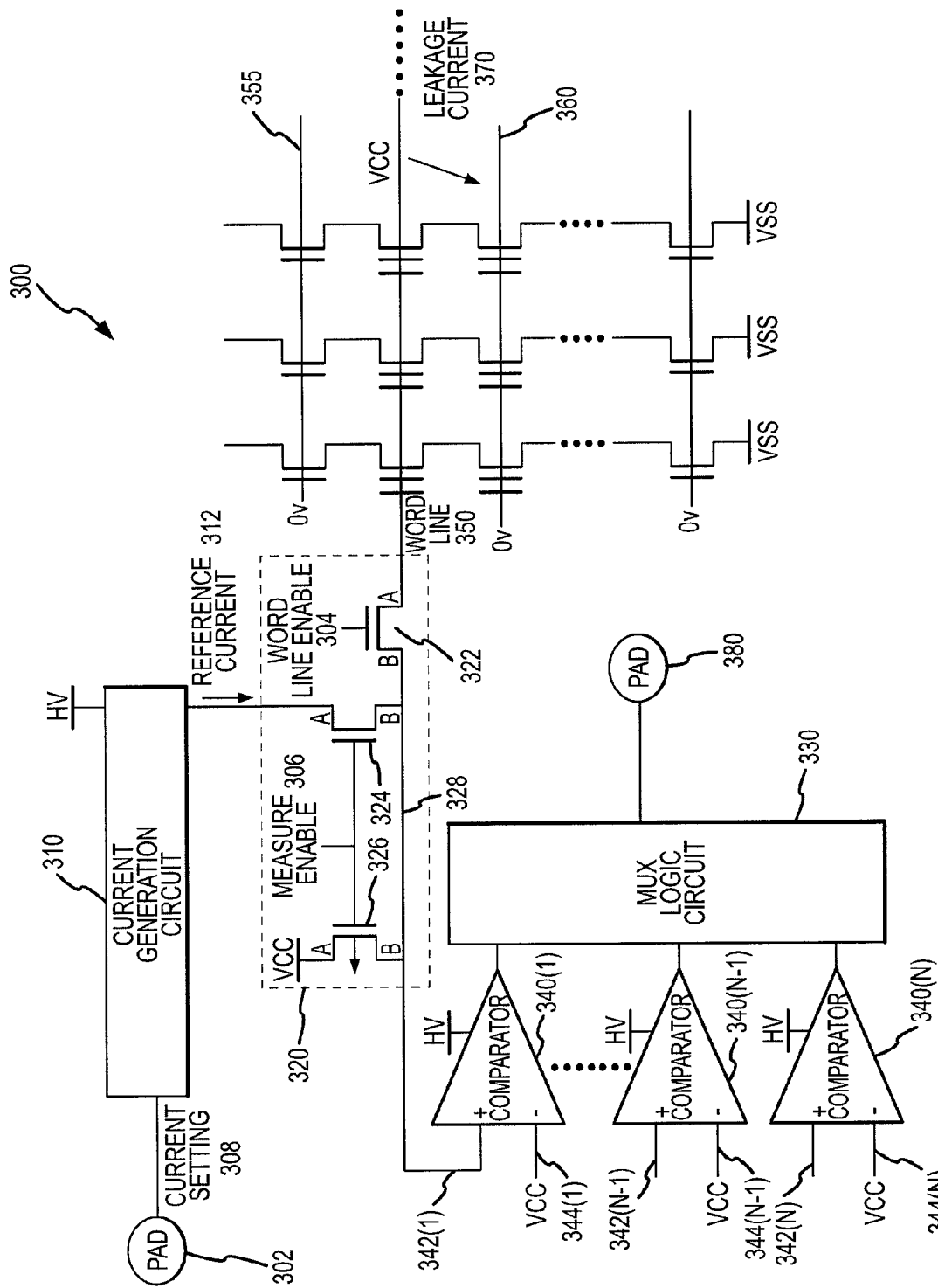
FIG. 3 is a schematic and block diagram illustrating measurement of leakage current on a plurality of word lines of a memory device using a leakage measurement circuit in the memory device according to one embodiment of the invention.

FIG. 3 is a schematic and block diagram of a leakage measurement system 300 for measuring leakage in the memory device 210 in accordance with one embodiment of the invention. As shown in FIG. 3, a current generation circuit 310 receives a current setting signal 308 from an input pad 302 and generates a reference current 312 at one of a number of current values based on the current setting signal 308. The current generation circuit 310 is connected in parallel to a number of measurement enable circuits 320. The number of measurement enable circuits required is the number of the word lines (or, word lines and select gates, in another embodiment, where leakage on the select gates is to be measured as well) in the memory device 210 on which leakage current is to be measured; for example, N. In other words, the current generation circuit 310 is connected in parallel to N measurement enable circuits 320. For simplicity, FIG. 3 only shows the current generation circuit 310 being connected to one of the N measurement enable circuits 320. In one embodiment, the reference current 312 may be supplied to only the word line (or select gate) on which leakage is to be measured. In an alternative embodiment, the current generation circuit 310 may be able to supply the same reference current to more than one word lines (and/or select gates), when leakage is measured on more than one word lines (and/or select gates) simultaneously, as the reference current 312 when leakage is measured on only one word line (or select gate).

Each of the measurement enable circuits 320 is connected to one of the word lines (and select gates, in an alternative embodiment) of the memory device 210, and is also connected to one of N comparing circuits, comparing circuits 340(1) through 340(N). The outputs of the comparing circuits 340(1)-340(N) are received at a selection circuit 330, which generates an output that is accessible externally through the output pad 380. In one embodiment, the current generation circuit 310 includes a number of current mirrors that generate a number of reference currents from a master reference current. Since the operation and structure of current mirrors are well known in the art, in the interest of brevity the following description will focus on the other aspects of the present invention.

In one embodiment, each of the measurement enable circuits 320 may enable the word line or select gate on which leakage current is measured by allowing the voltage level on the word line or select gate to be measured while a reference current is being supplied to the word line or select gate. As shown in FIG. 3, the measurement enable circuit 320 includes transistors 322, 324 and 326, each of which functions as a switch. In one embodiment, as shown in FIG. 3, the transistors 322 and 324 may each be a n-type metal-oxide-semiconductor (NMOS) transistor, and the transistor 326 may be a p-type metal-oxide-semiconductor (PMOS) transistor. In another embodiment, each of the transistors 322, 324 and 326 may be a switching circuit that is able to perform the functions described above. The transistors are connected and arranged so that the aforementioned functionality of the measurement enable circuit 320 can be achieved. Each of the transistors 322, 324 and 326 has one control terminal (e.g., the gate) and two signal terminals (e.g., the source and drain), terminals A and B. When a transistor 322, 324 or 326 is enabled, electrical current can flow from one terminal to the other. Conversely, when a transistor 322, 324 or 326 is disabled, there is no current flow between its terminals. In FIG. 3, terminal A of the transistor 322 is connected to a corresponding word line 350, and terminal B of the transistor 322 is connected to an input terminal of a corresponding comparing circuit. Terminal B of the transistor 322 is also connected to terminal B of the transistor 324 as well as terminal B of the transistor 326. The transistor 324 is connected to the current generation circuit 310 at its terminal A. Terminal A of the transistor 326 is connected to a voltage source that is at a predetermined voltage level. The predetermined voltage level, although shown to be Vcc in FIG. 3, can be set to any voltage level other than Vcc, including 0 volt, as will be described in detail below.

The control terminal of the transistor 322 is connected to receive a "word line enable" signal 304 that may have either a high (enable) value or a low (disable) value. The control terminal of the transistor 324 and the control terminal of the transistor 326 are not only connected to each other but also connected to receive a "measure enable" signal 306, which may have either a high (enable) value or a low (disable) value. The transistors 322 and 324 are chosen such that the transistors 322 and 324 are disabled when the signal on the control terminal is low, and enabled when the signal on the control terminal is high. Similarly, the transistor 326 is chosen such that it is enabled when the signal on its control terminal is low, and disabled when the signal is high.

In operation, before a word line/select gate is selected for leakage measurement, both the "word line enable" signal 304 and the "measure enable" signal 306 are low. In one embodiment, the timing of the changes in the "word line enable" signal 304 and the "measure enable" signal 306 (e.g., going from low to high) is arranged such that the "word line enable" signal 304 goes high first, followed by a period of time, before the "measure enable" signal 306 goes high. When both the "word line enable" signal 304 and the "measure enable" signal 306 are low, the transistors 322 and 324 are disabled while the transistor 326 is enabled. With the transistor 326 enabled, the predetermined voltage level at terminal A of the transistor 326 (e.g., Vcc) is applied to the electrical line 328 that connects terminal B of the transistors 322, 324 and 326 with one another and one of the inputs of the corresponding comparing circuit (e.g., 340(1)), and thereby sets the voltage on the electrical line 328 to be at the predetermined voltage level.

When the "word line enable" signal 304 goes high, both the transistor 322 and the transistor 324 are enabled. With the transistor 322 enabled, the word line 350 is electrically coupled to the electrical line 328, and the voltage levels on both are equalized. Since the voltage on the electrical line 328 has been previously set to the predetermined voltage level (e.g., Vcc), when the transistor 322 is enabled the voltage on the word line 350 is also set to the predetermined voltage level.

After a sufficient period of time that allows the voltage level on the word line 350 to settle at the predetermined voltage level (e.g., Vcc), the "measure enable" signal 306 goes high. This enables the transistor 324 and, at the same time, disables the transistor 326. Consequently, the voltage source at terminal A of the transistor 326 is electrically decoupled from the electrical line 328 as well as the word line 350. As such, any change in voltage level on the word line 350 and the electrical line 328 will be attributed to other factors, such as leakage. With the transistor 324 enabled, the current generation circuit 310 is electrically coupled to the electrical line 328 as well as the word line 350. As a result, the reference current 312 is supplied to the electrical line 328 as well as the word line 350 since the transistor 322 is still enabled. It should be noted that the current generation circuit 310 utilizes a voltage source that is at a voltage level (e.g., HV or the power source of the memory device 210) higher than the predetermined voltage level (e.g., Vcc) that the word line 350 and the electrical line 328 were set to.

Depending on the size of the leakage current 370 on the word line 350, the voltage level on the electrical line 328 and the word line 350 may increase or decrease as the reference current 312 is being supplied to the electrical line 328 and the word line 350. If the leakage current 370 on the word line 350 is smaller in magnitude than the current value of the reference current 312, then the voltage level on the word line 350 (and on the electrical line 328) should rise because more electrical charges are being supplied than are leaking out. In contrast, if the leakage current 370 on the word line 350 is larger in magnitude than the current value of the reference current 312, then the voltage level on the word line 350 (and on the electrical line 328) should fall because more electrical charges are leaking out than are being supplied.

As shown in FIG. 3, the comparing circuit 340(1) has a first input terminal 342(1), connected to the electrical line 328, and a second input terminal 344(1), connected to the predetermined voltage level that is present at terminal A of the corresponding transistor 326. The other comparing circuits 340(2)-340(N) are set up similarly, but for simplicity, only the connections of comparing circuit 340(1) are shown. Each of the comparing circuits 340(1)-340(N), therefore, compares the voltage level on its corresponding word line/select gate (which is electrically coupled to the electrical line that is physically connected to the first input terminal of the comparing circuit) with the predetermined voltage level that the word line/select gate was previously set to. In one embodiment, each of the comparing circuits 340(1)-340(N) is a comparator. In another embodiment, each of the comparing circuits 340(1)-340(N) may be a circuit that is able to compare two values.

In one embodiment, each of the comparing circuits 340(1)-340(N) may be enabled to compare the voltage levels on its two input terminals at some time after the "measure enable" signal 306 went high from low, in order to allow sufficient time for the voltage level on the word line/select gate of interest to either rise or fall for more accurate measurement. When the voltage level on the word line 350 is higher than the predetermined voltage level, signifying the leakage current 370 is smaller than the reference current 312, the comparing circuit 340(1) generates an output signal indicating a PASS. Likewise, when the voltage level on the word line 350 is lower than the predetermined voltage level, signifying the leakage current 370 is larger than the reference current 312, the comparing circuit 340(1) generates an output signal indicating a FAIL.

According to one embodiment of the present invention, simultaneous leakage measurement on all the word lines as well as individual leakage measurement on each of the word lines are achievable. More specifically, a PASS/FAIL result representative of the results from the leakage measurement on all the N word lines may be accessible at the output pad 380, and the individual PASS/FAIL result from the leakage measurement on each of the N word lines may also be accessible at the output pad 380. In one embodiment, the selection circuit 330 may be a multiplexing logic circuit, the operation and structure of which are known in the art. In another embodiment, the selection circuit 330 may be a circuit that is able to perform the function described herein. The selection circuit 330 receives the outputs of the comparing circuits 340(1)-340(N) and generates an output that is accessible externally through the output pad 380. For example, the selection circuit 330 may include N NAND logic circuits each of which receiving the output of a corresponding comparing circuit. In a simultaneous leakage measurement scenario, if one of the N word lines fails the leakage measurement at a given reference current value, the result seen at the output pad 380 will indicate a FAIL. This means that at least one of the word lines has an unacceptable leakage current compared to the reference current. Alternatively, in an individual leakage measurement scenario, the output of each of the comparing circuits 340(1)-340(N) may be connected to the output pad 380 by a transfer complementary metal-oxide-semiconductor (CMOS) logic, and thus the PASS/FAIL result for each of the N word lines may be individually seen at the output pad 380. In one embodiment, the selection of whether the type of leakage measurement is to be simultaneous leakage measurement or individual leakage measurement can be made by initial setting. For example, the selection may be included in the "reference current setting" stage. The selection circuit 380 can calculate or decode the outputs, based on the type of leakage measurement selected.

It should be appreciated by those skilled in the art that when leakage current is being measured on a particular word line the voltage level on its neighboring word lines may or may not be different from the voltage on the particular word line. For example, when the leakage current on word line 350 is being measured, as shown in FIG. 3, the voltage on the word line 350 may be set to Vcc volt while the voltage on the neighboring word lines 355 and 360 is set to 0 volt. This is to help identify the direction of the leakage current. Furthermore, if a particular word line is set to Vcc volt and is measured to have huge leakage while the voltage on its neighboring word lines is also Vcc volt, the leakage is not likely a word line-to-word line leakage. Accordingly, the voltage that is applied to each of the word lines/select gates and one of the input terminals of the corresponding comparing circuit may be set to a range of voltage levels. For example, the voltage on all the word lines may be set to Vcc. As another example, the voltage on the word lines may be set to Vcc while the voltage on the select gates may be set to 0 volt. Yet in another example, the voltage on the even-number word lines may be set to Vcc while the voltage on the odd-number word lines may be set to 0 volt, or vice versa. In a different example, the voltage on one word line or select gate may be set to Vcc while the voltage on all the other word lines is set to 0 volt. Alternatively, in the aforementioned examples where the voltage may be set to a voltage between Vcc and 0 (e.g., Vcc/2 or Vcc/3) in lieu of Vcc. A purpose of such voltage variation is to maximize the opportunity of identifying all the possible leakage paths. Therefore, with a combination of reference current variation and word line voltage variation, a thorough leakage measurement may be enabled by the present invention.

Figure 4:
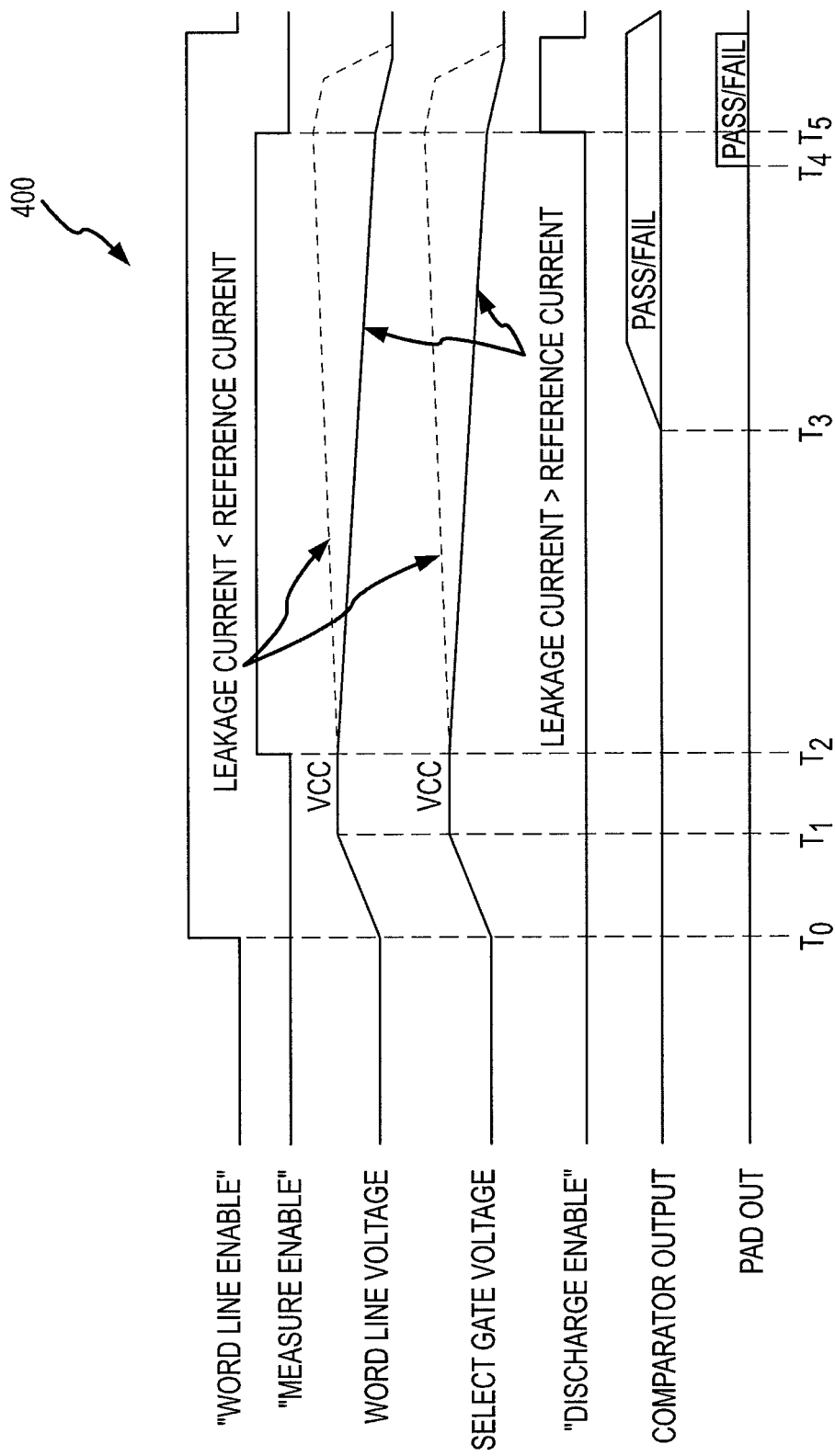
FIG. 4 is a timing diagram illustrating the operation of the leakage measurement circuit of FIG. 3.

FIG. 4 is a timing diagram 400 that illustrates an example of the operation of the leakage measurement circuit of FIG. 3 with respect to one of the word lines of the memory device 210. As shown, in one embodiment, initially the signals and voltage level start out being low and 0 volt, respectively. At time T0, the "word line enable" signal goes high, allowing the word line (or select gate) of interest to be electrically coupled to a predetermined voltage level (e.g., Vcc). At time T1, the voltage on the word line (or the select gate) has reached the predetermined voltage level. At time T2, the "measure enable" signal goes high, removing the predetermined voltage level from the word line (or the select gate) and allowing the reference current to be supplied to the word line (or select gate). As shown in FIG. 4, the voltage on the word line (or select gate) rises if the leakage current is smaller than the reference current, and the voltage on the word line (or select gate) falls if the leakage current is smaller than the reference current. At time T3, the corresponding comparing circuit is enabled to compare the voltage on the word line (or select gate) with the predetermined voltage level that the word line (or select gate) was set to between times T0 and T1. The comparing circuit then generates an output indicating PASS if the voltage on the word line (or select gate) is greater than the predetermined voltage level. Or, the comparing circuit generates an output indicating FAIL if the voltage on the word line (or select gate) is less than the predetermined voltage level. At time T4 the leakage measurement result is available and accessible externally at the output pad 380. At time T5 a "discharge enable" signal stops the supply of the reference current to the word line (or select gate) and renders the voltage on the word line (or select gate) to be discharged so as to return the voltage on the word line (or select gate) to its initial voltage (e.g., 0 volt).

Thus, a circuit and method for measuring leakage on the plurality of word lines in a memory device have been described. It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A memory device, comprising:
a plurality of memory cells;
a plurality of word lines coupled to the plurality of memory cells; and
a leakage measurement circuit coupled to the plurality of word lines, the leakage measurement circuit operable to generate a reference current and to determine whether a leakage current on the one of the plurality of word lines is acceptable relative to the reference current, wherein the leakage measurement circuit comprises:

a current generation circuit to generate the reference current at one of a plurality of current values;

a leakage test circuit coupled to the current generation circuit and the plurality of word lines, the leakage test circuit operable to compare the leakage current on each of the plurality of word lines with the reference current;

a selection circuit coupled to the leakage test circuit and operable to generate a signal indicating whether the leakage current on at least one of the plurality of word lines is acceptable; and a plurality of measurement enable circuits and a plurality of comparing circuits, and wherein:

each of the plurality of measurement enable circuits coupled to a respective one of the plurality of word lines and a respective one of the plurality of comparing circuits, each of the plurality of measurement enable circuits operable to set a word line voltage on the respective one of the plurality of word lines to a respective voltage level by coupling the respective one of the plurality of word lines to the respective voltage level responsive to a first control signal, each of the plurality of measurement enable circuits further operable to couple the respective one of the plurality of word lines to the respective one of the plurality of comparing circuits responsive to the first control signal, each of the plurality of measurement enable circuits further operable to decouple the respective one of the plurality of word lines from the respective voltage level responsive to a second control signal, and each of the plurality of measurement enable circuits further operable to supply the reference current to the respective one of the plurality of word lines by coupling the respective one of the plurality of word lines to the current generation circuit responsive to the second control signal.

2. The memory device of claim 1 wherein the leakage measurement circuit operable to generate the reference current at one of a plurality of current values and to determine whether the leakage current on one of the plurality of word lines is acceptable relative to the reference current at one of the plurality of current values.

3. The memory device of claim 1 wherein each of the plurality of comparing circuits operable to compare the word line voltage on a respective one of the plurality of word lines with a respective voltage level to indicate whether the leakage current on the respective one of the plurality of word lines is acceptable.

4. The memory device of claim 1 wherein the selection circuit comprises a multiplexer having a plurality of input terminals each of which coupled to an output terminal of a respective one of the plurality of comparing circuits, and an output terminal to generate the signal indicating whether a respective leakage current on at least one of the plurality of word lines is acceptable.

5. The memory device of 1 wherein the memory device comprises a flash memory device.

6. The memory device of claim 3 wherein:

each of the plurality of measurement enable circuits comprises:

a first switch having a control terminal to receive the first control signal, a first signal terminal coupled to a respective one of the plurality of word lines, and a second signal terminal coupled to a respective one of the plurality of comparing circuits, a second switch having a control terminal to receive the second control signal, a first signal terminal coupled to the current generation circuit, and a second signal terminal coupled to the second signal terminal of the first switch, and a third switch having a control terminal to receive the second control signal, a first signal terminal coupled to a respective voltage level, and a second signal terminal coupled to the second signal terminal of the first switch, and wherein:

each of the plurality of comparing circuits comprises a sense amplifier having a first input terminal coupled to the second signal terminal of the first switch, a second input terminal coupled to the respective voltage level, and an output terminal to generate the signal indicating whether a respective leakage current on the respective one of the plurality of word lines is acceptable.

7. The memory device of claim 6 wherein:

the first switch and the second switch comprise a n-type metal-oxide-semiconductor (NMOS) transistor, the third switch comprises a p-type metal-oxide-semiconductor (PMOS) transistor, and the sense amplifier comprises a comparator.

8. A computer system, comprising:

an input device;

an output device;

a processor coupled to the input device and the output device; and a memory device coupled to the processor and having a plurality of word lines, the memory device operable to generate a reference current in the memory device and to determine whether a leakage current on the one of the plurality of word lines is acceptable relative to the reference current, wherein the memory device comprises:

a current generation circuit to generate the reference current at one of the plurality of current values;

a leakage test circuit coupled to the current generation circuit and the plurality of word lines, the leakage test circuit operable to compare the leakage current on each of the plurality of word lines with the reference current;

a selection circuit coupled to the leakage test circuit and operable to generate a signal indicating whether the leakage current on at least one of the plurality of word lines is acceptable; and a plurality of measurement enable circuits and a plurality of comparing circuits, wherein:

each of the plurality of measurement enable circuits coupled to a respective one of the plurality of word lines and a respective one of the plurality of comparing circuits, each of the plurality of measurement enable circuits operable to set a word line voltage on the respective one of the plurality of word lines to a respective voltage level by coupling the respective one of the plurality of word lines to the respective voltage level responsive to a first control signal, each of the plurality of measurement enable circuits further operable to couple the respective one of the plurality of word lines to the respective one of the plurality of comparing circuits responsive to the first control signal, each of the plurality of measurement enable circuits further operable to decouple the respective one of the plurality of word lines from the respective voltage level responsive to a second control signal, and each of the plurality of measurement enable circuits further operable to supply the reference current to the respective one of the plurality of word lines by coupling the respective one of the plurality of word lines to the current generation circuit responsive to the second control signal.

9. The computer system of claim 8 wherein the memory device operable to generate the reference current at one of the plurality of current values, and wherein determining whether the leakage current on one of the plurality of word lines is acceptable relative to the reference current comprises determining whether the leakage current on one of the plurality of word lines is acceptable relative to the reference current at one of the plurality of current values.

10. The computer system of claim 8 wherein each of the plurality of comparing circuits operable to compare the word line voltage on a respective one of the plurality of word lines with a respective voltage level to indicate whether the leakage current on the respective one of the plurality of word lines is acceptable.

11. The computer system of claim 8 wherein the selection circuit comprises a multiplexer having a plurality of input terminals each of which coupled to an output terminal of a respective one of the plurality of comparing circuits, and an output terminal to generate the signal indicating whether a respective leakage current on at least one of the plurality of word lines is acceptable.

12. The computer system of 8 wherein the memory device comprises a flash memory device.

13. The computer system of claim 10 wherein:
each of the plurality of measurement enable circuits comprises:
a first switch having a control terminal to receive the first control signal, a first signal terminal coupled to a respective one of the plurality of word lines, and a second signal terminal coupled to a respective one of the plurality of comparing circuits,
a second switch having a control terminal to receive the second control signal, a first signal terminal coupled to the current generation circuit, and a second signal terminal coupled to the second signal terminal of the first switch, and
a third switch having a control terminal to receive the second control signal, a first signal terminal coupled to a respective voltage level, and a second signal terminal coupled to the second signal terminal of the first switch, and wherein:
each of the plurality of comparing circuits comprises a sense amplifier having a first input terminal coupled to the second signal terminal of the first switch, a second input terminal coupled to the respective voltage level, and an output terminal to generate the signal indicating whether a respective leakage current on the respective one of the plurality of word lines is acceptable.

14. The computer system of claim 13 wherein:
the first switch and the second switch comprise a n-type metal-oxide-semiconductor (NMOS) transistor,
the third switch comprises a p-type metal-oxide-semiconductor (PMOS) transistor, and
the sense amplifier comprises a comparator.

* * * * *